March 2, 1965 E. G. BALDUCCI 3,171,204

DESIGNING PRINTED CIRCUIT LAYOUTS

Filed Dec. 5, 1960

INVENTOR.
EDMUND G. BALDUCCI.
BY
[signature]
ATTORNEY.

United States Patent Office 3,171,204
Patented Mar. 2, 1965

3,171,204

DESIGNING PRINTED CIRCUIT LAYOUTS

Edmund G. Balducci, Dalton, Mass., assignor to General Electric Company, a corporation of New York Filed Dec. 5, 1960, Ser. No. 73,818
3 Claims. (Cl. 33—1)

This invention relates to designing printed circuit layouts. More particularly, it relates to a system wherein printed circuit layouts may be accomplished without drawing, and masters for use in etching printed circuit boards may be made directly by photographic processes.

It is now necessary in the layout design of printed circuit boards for a design draftsman to lay out the circuit more or less by conventional drafting methods. The draftsman tries his best to draw the components on paper in such a manner that the necessary electrical connections can be made without printed lines crossing and the components can be reasonably fit onto the board. For circuits of any complexity, it is almost impossible to accomplish this task in one or two attempts. Therefore, it is necessary for the draftsman to make many erasures and then to redraw the components in new selected locations. These new locations are perhaps only a very small distance away from the old locations. It is important that the final product of the design draftsman should clearly indicate both the location of specific components and the location of the electrical connections to be printed on the board. Often the geometrical placement of printed electrical connections is shown by placing runners of thin black tape on the drawing to facilitate using a negative of the drawing directly in a process of etching the printed electrical connections of the board.

It is an important object of the present invention to reduce the time and difficulty presently inherent in designing a printed circuit layout.

It is an additional object to provide a system for laying out printed circuits whereby the layout may be accomplished without the drawing of any lines being necessary.

Still further objects and features will become apparent as the following description proceeds.

Briefly stated, according to the present invention, a transparent board is provided having therein an orderly matrix of holes adapted to serve as female plugs. Component models having male plugs adapted to fit the female plugs of the board are fixed by a layout designer in a desired configuration onto one side of the transparent board. Black tape runners are fixed onto the other side of the transparent board in desired locations to represent electrical connections. When a satisfactory configuration has been obtained, the result may be photocopied with and without component models in place to provide the necessary layout information.

While the specification concludes with claims particularly pointing out and distinctly claiming the subject matter of the present invention, it is believed that the invention will be better understood from the following description taken in connection with the accompanying drawing in which:

Figures 1, 2, 3, 4, 5, 6:
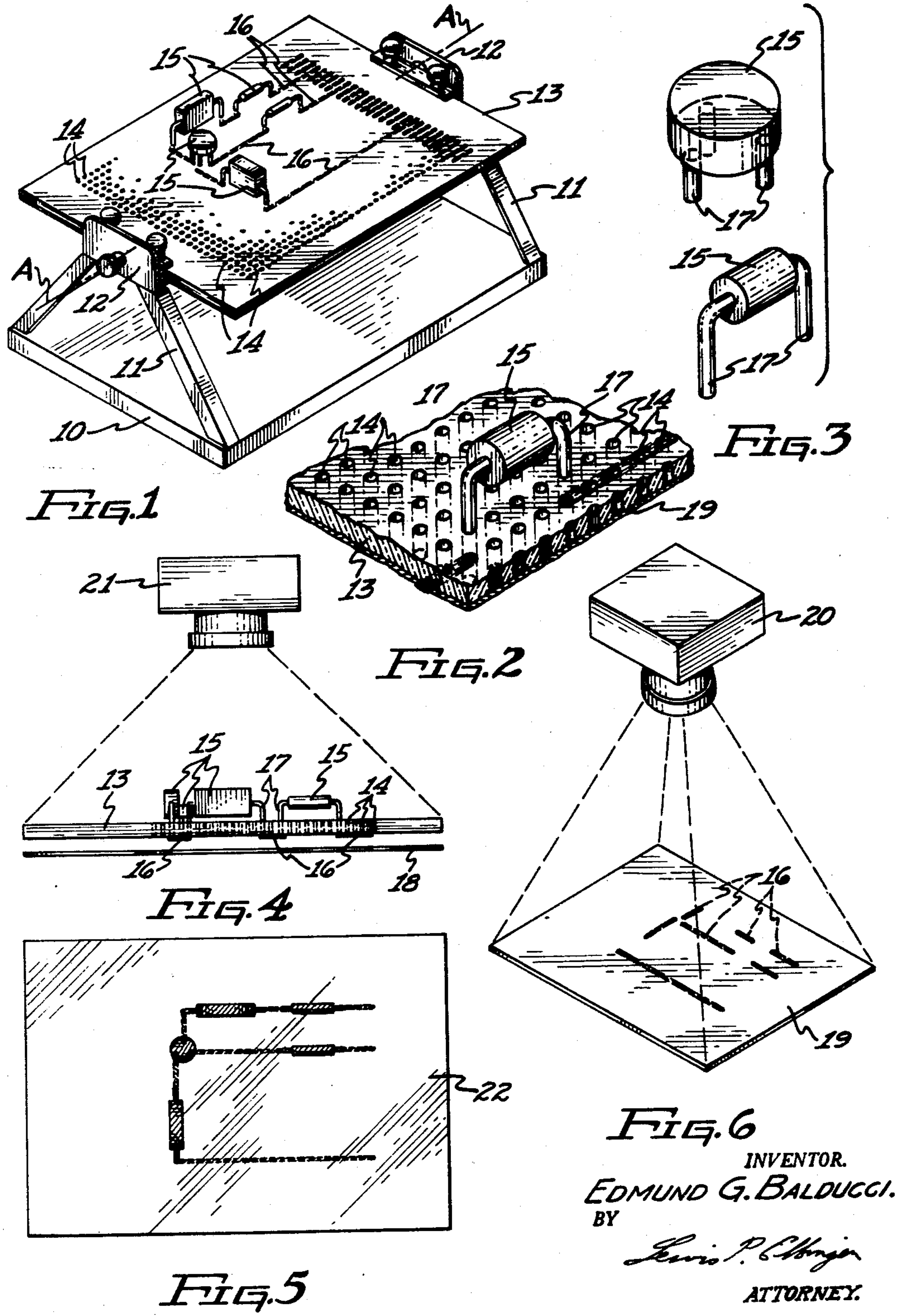
FIGURE 1 is a perspective view of an embodiment of the present invention illustrating a working arrangement for laying out a printed circuit.
FIGURE 2 is a fragmentary perspective view of a portion of the transparent board of FIGURE 1 illustrating an alternative embodiment.
FIGURE 3 is a perspective view of two example model components of the type used in the present invention.
FIGURE 4 is a sectional view of a completed board of the present invention in position to be photographed or contact printed.
FIGURE 5 is illustrative of a photograph or contact print as made by the apparatus of FIGURE 4.
FIGURE 6 is a perspective view of a printed circuit wiring layout as accomplished in the alternative embodiment of present invention in position to be photographed or contact printed.

FIGURE 1 illustrates the apparatus of the present invention in position for practicing the invention. Transparent board 13 is held by rotatable clamps 12. The rotatable clamps 12 are supported by the side supports 11, and the side supports 11 are mounted on a base piece 10. Transparent board 13 is mounted in rotatable clamps 12 so that it may be held parallel to base piece 10, if desired, or rotated about axis A—A and held at any desired angle.

The transparent board 13 has an orderly matrix of holes 14 therein. Referring to FIGURE 1, several model components 15 are shown plugged into the holes 14 in transparent board 13. Attached to the under side of the transparent board 13 are opaque runners 16 in the form of black tape adhering to the transparent board 13. FIGURE 3 is an enlarged view of example model components 15 as shown in FIGURE 1 illustrating thereon the legs 17 adapted to fit the holes 14 of the transparent board 13.

According to one specific embodiment of the present invention, a $^3/_{16}$-inch-thick sheet of a material which is transparent and has satisfactory dimensional stability is selected. Polymers such as those known as Plexiglas and Lucite are satisfactory. The sheet of material is rectangular and is 20 inches x 15 inches in dimension. On an inner rectangular portion of the sheet, 15½ x 11 inches in dimension, a grid pattern is scribed which consists of horizontal lines .2 inch apart and vertical lines .2 inch apart. At each intersection of the grid pattern, a hole .046 inch in diameter is drilled. The result is the transparent board 13 having an orderly matrix of holes 14 drilled therein. Scale models of selected components are then made in quantity from a transparent material such as Lucite or Plexiglas. The legs (representing component leads) are made .041 inch in diameter. The spacing of the legs is made a whole number multiple of .2 inch so that all components will fit anywhere on the transparent board. In other words, the pattern of the legs on all the model components are made such that the model components may be plugged easily into the board.

The transparent board 13 and the model components 15 of the present invention may be sized as scale models of the actual components and printed circuit boards to be manufactured. It will normally be most practical if the transparent board 13 and model components 15 are made larger, say double size, than the actual printed board and actual components. This is because the larger size transparent board and model components are easier for the layout designer to work with than most actual-size equipment. Since photographic information is eventually used in the practice of the present invention, both to secure the assembly information and to provide masters for etching printed electrical connections on the printed circuit boards, the oversize system for practicing the present invention is practical. This is due to the recognized ease with which the information obtained may be scaled down to actual scale by photographic processes. The selection in any specific instance of the geometry and size of the transparent board and the hole spacing therein is clearly dictated by the type of printed circuit board desired as a final product, and specifications of component spacing, electrical connection spacing etc. should be considered.

In practicing the method of the present invention, it is convenient to have the transparent board 13 mounted as shown in FIGURE 1 to provide a layout designer with easy access to both sides of the transparent board 13 and to have the transparent board 13 held securely at a convenient angle. In addition to the transparent board of the present invention, certain other materials should be available for convenient access during the layout procedure. Models (such as those shown in FIGURE 3) representative of all of the components to be used in assembling the board should be available in quantity as in sorted boxes. A roll of thin black tape (opaque in nature) of a type which will stick to the bottom of the transparent board 13 should also be available. The layout designer will usually be assembling the board from an electrical diagram to which he has access.

In performing the method of the present invention, the layout designer may easily sample the effect of fixing the various components at various places on the board to determine preferred relationships of position among them so as to be able to best simplify the printed circuit arrangement in conformance with principles well known in the art. In fixing tape runners on the underside of the transparent board 13, which tape is representative of printed electrical connections, he will, of course, be able to see his proposed wiring arrangements through the transparent board 13 while continuing simultaneously his sampling of component placement possibilities.

Since the positions in which the opaque runners 16 are placed are representative of the positions in which printed electrical connections will be placed on the printed circuit board which is being layed out, the layout designer will position the opaque runners 16 so that an end or terminal of each opaque runner 16 is located at a hole 14 into which a leg 17 of a model component 15 is plugged. The legs 17, of course, represent component leads.

It has been found that even complex and crowded circuit arrangements can be designed using such a method within reasonable, and sometimes strikingly short, time periods as compared to conventional methods of drafting, wherein many erasures must usually be made as the layout draftsman samples placement positions of the components. When a final arrangement has been determined, and all required tape runners 16 have been placed under the transparent board 13 and all required component models 15 have been inserted into the holes 14 on the top side of the transparent board 13, the transparent board 13 may be removed from the rotable clamps 12 and the layout design is ready for photographic reproduction.

FIGURE 4 illustrates an assembled layout design of the present invention, with the component models 15 in place, in position to be photographed or contact printed to provide information for use in the making of a final assembly drawing. The transparent board 13 having holes 14 has fixed thereto component models 15 whose legs 17 are inserted in the holes 14. Opaque runners 16 adhere to the bottom of transparent board 13. The sheet of photographic film 18 illustrated in FIGURE 4 is adjacent the bottom of transparent board 13 and may be placed as close as desired, even touching, to transparent board 13. By the use of a light source 21, properly positioned, for example as shown in FIGURE 4, a negative and, from it, a contact print may be made of the layout design. The resulting contact print 22, as exemplified by the illustration of FIGURE 5, gives information both as to component placement on the board and as to the location of the printed runs on the board. If a photograph of the assembled layout is preferred to a contact print, the sheet of photographic film 18 is unnecessary, a camera may be substituted for light source 21, and a photograph may be taken. After the assembly information is obtained as above described, model components 15 may be removed from transparent board 14 and a second photographic or contact print negative may be made of transparent board 13 including only the opaque runners 16. This second negative procured in the above manner shows the desired printed electrical connections and may be used directly as a negative for, or in making negatives for, use in the etching process of manufacturing printed boards.

Alternatively to the above described method, a thin sheet of transparent or semitransparent material may be affixed to the underside of transparent board 13 before the opaque runners 16 are put in place. Paper is a suitable material to be so affixed. FIGURE 2 shows the position in which such a transparent sheet 19 may be affixed. The transparent sheet 19 of paper may be firmly held adjacent the underside of transparent board 13 in many suitable ways. One satisfactory method is to tape the corners or edges of the transparent sheet 19 to the corners or edges of transparent board 13. The procedure of laying out the printed circuit is then performed as described above, except that the opaque runners 16 are now affixed to the transparent sheet 19 of paper rather than to the underside of transparent board 13. Then when the layout design has been completed, the transparent sheet 19 having thereon the opaque runners 16 representing the printed circuit, may be removed from transparent board 13 and a contact print made directly from this transparent sheet 19.

FIGURE 6 illustrates such a transparent sheet 19 having on its underside opaque runners 16 in position to be photographed by the camera 20. Contact printing may also be used. In this alternative method, utiltizing transparent sheet 19, the model components 15 need not be removed from transparent board 13 in order to photographically reproduce the printed circuit wiring layout. If desired, the transparent board 13 with model components 15 in the desired locations may be used directly by a draftsman in making an assembly drawing showing the component locations on the printed circuit board.

It may be seen, of course, that the present invention may be reduced to practice in a great number of ways, depending upon the materials desired to be used for the transparent assembly board, the models involved, and the opaque runners. In addition, there exists a wide latitude of choice as to ratio of model size to actual size, size and spacing of holes in the board, size and geometry of component leads, and other obviously modifiable features.

While the principles of the invention have now been made clear in illustrative embodiments, there will be immediately obvious to those skilled in the art many modifications in structure, arrangement, proportions, the elements, materials and components used in the practice of the invention, and otherwise, which are particularly adapted for specific environments and operating requirement, without departing from those principles. The appended claims are, therefore, meant to cover and embrace any such modification, within the limits only of the true spirit and scope of the invention.

What is claimed is:

1. A product adapted for use in laying out printed circuit boards comprising: a transparent board having a first surface including therein an orderly matrix of perforations and a second surface adapted to have opaque runners simulating electrical conductors fixed thereon; a plurality of models of electrical components fixed to said first surface, said models having plugs adapted to fit into said perforations; and a plurality of opaque runners fixed to said second surface and interconnecting the plugs of given models in a simulated predetermined electrical circuit arrangement.

2. A product adapted for use in laying out printed circuit boards comprising: a transparent board having a first surface including therein a matrix of perforations; a sheet of transparent material having a first surface adapted to have opaque runners simulating electrical conductors fixed thereon; means for holding the second surface of said sheet in fixed adjacent relationship with the second surface of said board; a plurality of models of electrical components fixed to said first surface of said board, said models having plugs adapted to fit into said perforations; and a plurality of opaque runners fixed to said first surface of said sheet and interconnecting the plugs of said models in a predetermined simulated electrical circuit arrangement.

3. A product adapted for use in laying out printed circuit boards comprising: a transparent board having a first surface including therein an orderly matrix of perforations; a sheet of transparent material having a first surface adapted to have opaque runners simulating electrical conductors fixed thereon; means for holding the second surface of said sheet in fixed adjacent relationship with the second surface of said board; a plurality of models of electrical components fixed to said first surface of said board, said component models having plugs adapted to fit said perforations; and a plurality of opaque runners fixed to said first surface of said sheet and interconnecting the plugs of given models in a simulated predetermined electrical circuit arrangement.

References Cited by the Examiner

UNITED STATES PATENTS

| | | | |
|---|---|---|---|
| 1,181,163 | 5/16 | Pilkington. | |
| 1,736,445 | 11/29 | Jannenga. | |
| 2,523,508 | 9/50 | Ledgett | 35—16 |
| 2,545,409 | 3/51 | McCall | 33—1 |
| 2,610,413 | 9/52 | Dasey. | |
| 2,835,987 | 5/58 | Heiser. | |
| 2,958,948 | 11/60 | Dunkelberger | 33—1 |

FOREIGN PATENTS

| | | |
|---|---|---|
| 566,118 | 8/57 | Italy. |

OTHER REFERENCES

Product Engineering, June, 1956 (page 223 relied upon).

ISAAC LISANN, *Primary Examiner.*